US010251256B2

(12) United States Patent
Ikeda et al.

(10) Patent No.: US 10,251,256 B2
(45) Date of Patent: Apr. 2, 2019

(54) HEAT DISSIPATING STRUCTURE

(71) Applicant: SHINDENGEN ELECTRIC MANUFACTURING CO., LTD., Tokyo (JP)

(72) Inventors: Kosuke Ikeda, Hanno (JP); Yuji Morinaga, Hanno (JP); Osamu Matsuzaki, Hanno (JP)

(73) Assignee: Shindengen Electric Manufacturing Co., Ltd., Tokyo (JP)

( * ) Notice: Subject to any disclaimer, the term of this patent is extended or adjusted under 35 U.S.C. 154(b) by 0 days.

(21) Appl. No.: 15/508,127

(22) PCT Filed: Oct. 29, 2014

(86) PCT No.: PCT/JP2014/078715
§ 371 (c)(1),
(2) Date: Mar. 2, 2017

(87) PCT Pub. No.: WO2016/067377
PCT Pub. Date: May 6, 2016

(65) Prior Publication Data
US 2017/0303385 A1 Oct. 19, 2017

(51) Int. Cl.
*H05K 1/02* (2006.01)
*H05K 1/18* (2006.01)
(Continued)

(52) U.S. Cl.
CPC .......... *H05K 1/021* (2013.01); *H01L 23/3672* (2013.01); *H01L 25/07* (2013.01);
(Continued)

(58) Field of Classification Search
CPC ............ H05K 1/021; H05K 1/18; H05K 7/20; H05K 2201/10189; H05K 2201/10166;
(Continued)

(56) References Cited

U.S. PATENT DOCUMENTS 5,940,272 A  8/1999 Emori et al.
2006/0221573 A1* 10/2006 Li ..................... G11C 5/143
                                                  361/704
(Continued)

FOREIGN PATENT DOCUMENTS

DE  102004036982 A1  3/2006
EP      2426715 A1  3/2012
(Continued)

OTHER PUBLICATIONS

Kikuchi Masao, Usui Osam, "Power Semiconductor Device", Jun. 9, 2011, Mitsubishi Electric Corp, Entire Document (Translation of JP 2011114176, Original Copy Already Provided on Mar. 2, 2017).*
(Continued)

*Primary Examiner* — Anatoly Vortman
*Assistant Examiner* — Stephen S Sul
(74) *Attorney, Agent, or Firm* — The Harris Firm

(57) ABSTRACT

The present invention provides a heat dissipating structure with high heat dissipation performance while reducing the electric resistance. A heat dissipating structure includes: a heat sink having a base portion, and a plurality of heat dissipating fins provided upright on a first surface of the base portion; a first heat generating component provided on a side of the first surface of the base portion while being in contact with at least one heat dissipating fin of the plurality of heat dissipating fins; a circuit board joined to a second surface, opposite to the first face, of the base portion while being electrically connected to the first heat generating component; a second heat generating component provided on the circuit board, the second heat generating component generating a smaller amount of heat than the first heat generating component; and a connector electrically connecting the first heat generating component and the second heat generating component. The connector has a first outlet into which a first
(Continued)

connecting terminal on a side of the first heat generating component is insertable, and a second outlet into which a second connecting terminal on a side of the second heat generating component is insertable.

6 Claims, 7 Drawing Sheets

(51) Int. Cl.
| | | |
|---|---|---|
| *H01L 25/07* | (2006.01) | |
| *H01L 25/18* | (2006.01) | |
| *H01L 23/367* | (2006.01) | |
| *H05K 7/20* | (2006.01) | |
| *H05K 3/00* | (2006.01) | |

(52) U.S. Cl.
CPC ............... *H01L 25/18* (2013.01); *H05K 1/18* (2013.01); *H05K 7/209* (2013.01); *H01L 2924/0002* (2013.01); *H05K 3/0061* (2013.01); *H05K 2201/066* (2013.01); *H05K 2201/10015* (2013.01); *H05K 2201/10022* (2013.01); *H05K 2201/10166* (2013.01); *H05K 2201/10174* (2013.01); *H05K 2201/10189* (2013.01)

(58) Field of Classification Search
CPC ....... H05K 2201/10015; H05K 3/0061; H05K 2201/066; H05K 2201/10174; H05K 2201/10022; H05K 7/20918; H05K 7/2089–7/209; H01L 23/3672; H01L 25/18; H01L 25/07; H01L 2924/0002; H01L 23/36–23/3738; H01L 23/367–23/3677; H01L 23/4871; H01L 23/4882
USPC .................... 361/676, 679.54, 702, 703, 709
See application file for complete search history.

(56) References Cited

U.S. PATENT DOCUMENTS

| | | | |
|---|---|---|---|
| 2007/0139896 A1 | 6/2007 | Yamada et al. | |
| 2008/0218974 A1* | 9/2008 | Bartley | ............... H01L 25/0657 361/709 |
| 2008/0277780 A1 | 11/2008 | Hayakawa | |
| 2009/0231810 A1* | 9/2009 | Liang | .................... H01L 23/473 361/699 |
| 2011/0100598 A1 | 5/2011 | Gommel et al. | |
| 2011/0241198 A1* | 10/2011 | Azuma | ................. H01L 23/051 257/696 |
| 2011/0286179 A1 | 11/2011 | Motschman et al. | |
| 2017/0311482 A1* | 10/2017 | Ikeda | ...................... H01L 23/36 |

FOREIGN PATENT DOCUMENTS

| | | |
|---|---|---|
| JP | A-50-125258 | 10/1975 |
| JP | U-A-05-069995 | 9/1993 |
| JP | A-10-051912 | 2/1998 |
| JP | A-2002-100715 | 4/2002 |
| JP | A-2003-273319 | 9/2003 |
| JP | A-2008-282931 | 11/2008 |
| JP | 2010-187504 A | 8/2010 |
| JP | 2011-103395 A | 5/2011 |
| JP | 2011-114176 A | 6/2011 |
| JP | 2013-110181 | 6/2013 |
| JP | 2014-154391 | 8/2014 |
| WO | WO-2005/091692 A1 | 9/2005 |
| WO | WO-2014/132425 A1 | 9/2014 |

OTHER PUBLICATIONS

International Search Report (ISR) relating to International Application No. PCT/JP2014/078715, dated Feb. 3, 2015.
Written Opinion of the ISA relating to International Application No. PCT/JP2014/078715, dated Feb. 3, 2015.
Response to ISA Written Opinion, dated Mar. 20, 2015.
Amendment filed in International Application No. PCT/JP2014/078715 under PCT Article 34, dated Mar. 20, 2015.
IPEA Receipt of the Demand for International Preliminary Examination of the International Application, dated Apr. 7, 2015.
Written Opinion of the IPEA relating to International Application No. PCT/JP2014/078715, dated Apr. 28, 2015.
International Preliminary Report on Patentability relating to International Application No. PCT/JP2014/078715, dated Sep. 15, 2015.
European Patent Office, Supplementary European Search Report, relating to European Application No. 14904817.5, dated May 3, 2018.

* cited by examiner

HEAT DISSIPATING STRUCTURE

CROSS REFERENCE TO PRIOR APPLICATION(S)

This application is a U.S. National Stage Patent Application of PCT International Patent Application Ser. No. PCT/JP2014/078715 (filed on Oct. 29, 2014) under 35 U.S.C. § 371, which is hereby incorporated by reference herein in its entirety.

TECHNICAL FIELD

The present invention relates to a heat dissipating structure.

BACKGROUND ART

For example, as a heat dissipating structure of heat generating components such as electronic components, a heat dissipating structure using a heat sink is known (see Patent Document 1). A heat dissipating structure of Patent Document 1 uses a heat sink including a base portion, and a plurality of heat dissipating fins provided upright on a first surface of the base portion. On a second surface opposite to the first surface of the base portion, all the heat generating components to be cooled are placed. Heat of the heat generating components transmits via the base portion to the heat dissipating fins, and is dissipated from the heat dissipating fins to the outside.

CITATION LIST

Patent Document

[Patent Document 1] Japanese Unexamined Patent Application, First Publication No. 2013-110181

DISCLOSURE OF THE INVENTION

Problems to be Solved by the Invention

In the above-described heat dissipating structure using the heat sink, although the contrivance such as the provision of the heat dissipating fins in order to increase heat dissipation performance, there is room for further improvement in terms of the heat dissipation performance. For example, in a case where heat generating components that generate a relatively large amount of heat, such as power devices, are cooled, a heat dissipating structure with high heat dissipation performance is necessary.

Additionally, in the above-described heat dissipating structure described in Patent Document 1, a plurality of heat generating components and a plurality of electronic components that control the plurality of these heat generating components are disposed on the same surface side of the heat sink. In this case, it is necessary to dispose wires for electrically connecting the heat generating components and the electronic components on the same surface side of the heat sink. In this configuration, however, electric resistance increases due to an increase in the number of wires and complexity of wire routing, thus causing an increase in power loss.

One aspect of the present invention is to provide a heat dissipating structure that achieves high heat dissipation performance while reducing the electric resistance.

Means for Solving the Problems

A heat dissipating structure according to one aspect of the present invention includes: a heat sink having a base portion, and a plurality of heat dissipating fins provided upright on a first surface of the base portion; a first heat generating component provided on a side of the first surface of the base portion while being in contact with at least one heat dissipating fin of the plurality of heat dissipating fins; a circuit board joined to a second surface, opposite to the first face, of the base portion while being electrically connected to the first heat generating component; a second heat generating component provided on the circuit board, the second heat generating component generating a smaller amount of heat than the first heat generating component; and a connector electrically connecting the first heat generating component and the second heat generating component. The connector has a first outlet into which a first connecting terminal on a side of the first heat generating component is insertable, and a second outlet into which a second connecting terminal on a side of the second heat generating component is insertable.

Effects of the Invention

According to one aspect of the present invention, the first heat generating component is disposed on the first surface side of the base portion, and is made in contact with the heat dissipating fin, thus efficiently performing heat dissipation. Additionally, the first heat generating component is electrically connected via a connector to the second heat generating component disposed on the second surface side, thus achieving the heat dissipating structure with high heat dissipation performance while reducing the electric resistance.

MODE FOR CARRYING OUT THE INVENTION

Figure 1:
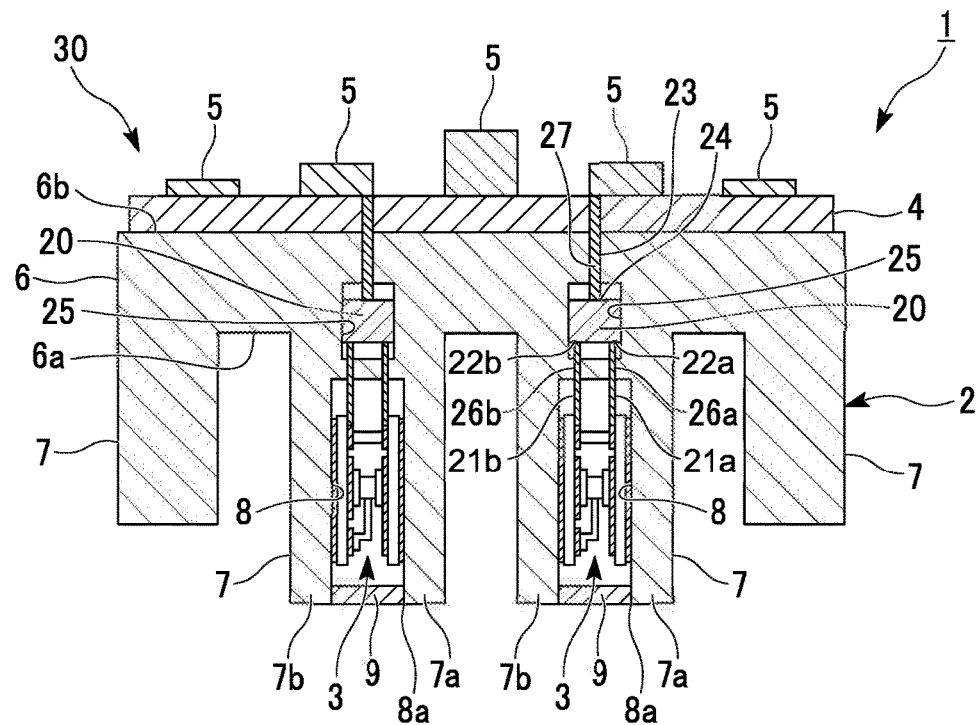
FIG. 1 is a cross-sectional view showing an example of a heat dissipating structure according to an embodiment of the present invention.

Hereinafter, embodiments of the present invention will be described in detail with reference to the accompanying drawings.

Here, in the following description, for clarification of respective components, some components are occasionally illustrated in different scale size in the drawings.

Figure 2:
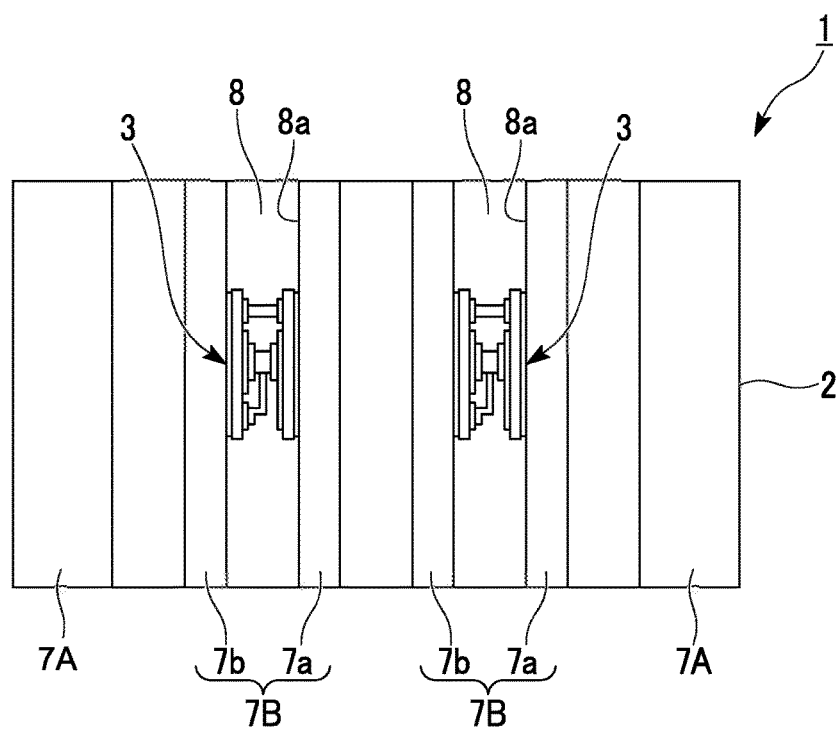
FIG. 2 is a plan view, viewed from a first surface side, showing the heat dissipating structure shown in FIG. 1.

With reference to FIGS. 1 and 2, a heat dissipating structure 1 according to an embodiment of the present invention will be described.

As shown in FIGS. 1 and 2, the heat dissipating structure 1 is a structure of a semiconductor device including a heat sink 2, a plurality of semiconductor modules (first heat generating components) 3, a circuit board 4, and a plurality of electronic components (second heat generating components) 5, and is configured to dissipate heat generated by the semiconductor modules 3 and the electronic components 5 via the heat sink 2.

Specifically, in this heat dissipating structure 1, the heat sink 2 is made of, for example, a material having a high thermal conductivity, such as Cu and Al. The heat sink 2 has a base portion 6 and a plurality of heat dissipating fins 7A and 7B. The base portion 6 is formed in a rectangular plate shape. Each of the heat dissipating fins 7A and 7B is formed in a rectangular plate shape and is provided perpendicularly to a first surface 6a of the base portion 6. Additionally, the plurality of heat dissipating fins 7A and 7B are positioned at both ends, and between the both ends, of the base portion 6 in a longer direction (horizontal direction in FIG. 2), and are arranged while being spaced from one another. Further, each of the heat dissipating fins 7A and 7B is provided upright between both ends of the base portion 6 in a shorter direction (vertical direction in FIG. 2).

In the present embodiment, the plurality of heat dissipating fins 7A and 7B are provided in the longer side direction of the base portion 6 such that the two heat dissipating fins 7A are positioned along the both ends of the base portion 6 in its longer side, and the two heat dissipating fins 7B are positioned between the two heat-dissipating fins 7A. Additionally, the heat dissipating fins 7B have larger dimensions in the height and thickness directions than the heat dissipating fins 7A, since a semiconductor module 3 is placed into the heat dissipating fin 7B. Here, the heat sink 2 is not necessarily limited to those of this embodiment, and can be implemented by appropriately modifying the number, size, or the like of the respective heat dissipating fins 7A and 7B.

The heat dissipating fin 7B is provided with an insertion groove 8. The insertion groove 8 holds the semiconductor module 3 that is insertable from an insertion opening 8a provided on an end side of the heat dissipating fin 7B. Specifically, the insertion groove 8 is a notch extending perpendicularly to the first surface 6a from the end side of the heat dissipating fin 7B, having a constant width, and having a depth enough to insert the semiconductor module 3 therein. The heat dissipating fin 7B is divided by the insertion groove 8 into two fin portions 7a and 7b.

Additionally, the heat dissipating fin 7B is provided with a lid member 9 (not shown in FIG. 2) that closes the insertion opening 8a. The lid member 9 is mounted so as to close the insertion opening 8a in a state where the semiconductor module 3 is inserted into the insertion groove 8. Here, the mounting structure of the lid member 9 is not necessarily limited to this structure, and may be a structure such that the lid member 9 is mounted so as to sandwich the heat dissipating fin 7B from the width direction of the insertion groove 8. Additionally, the lid member 9 may be omitted.

Figure 3:
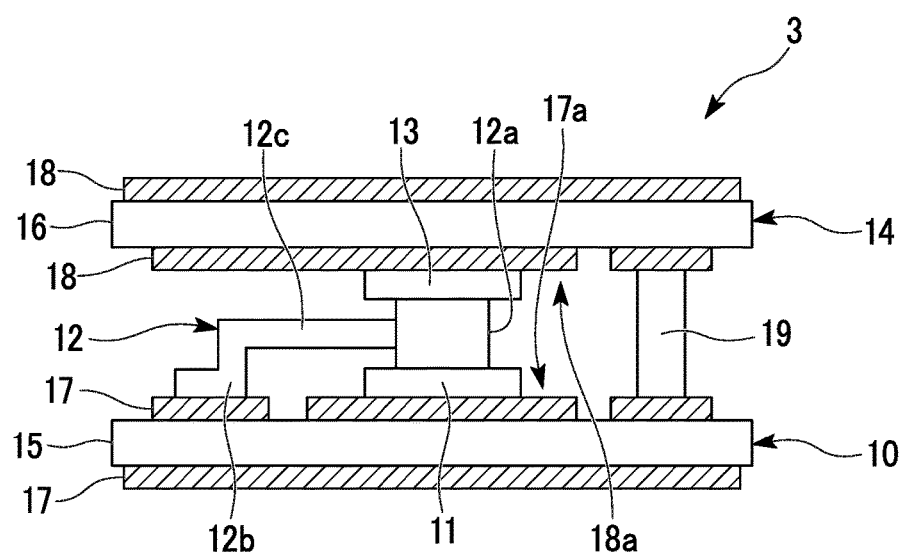
FIG. 3 is an enlarged cross-sectional view showing a semiconductor module shown FIG. 1.

As shown enlarged in FIG. 3, the semiconductor module 3 includes a first substrate 10, a first semiconductor element 11, a connector 12, a second semiconductor element 13, and a second substrate 14, which are layered in this order.

Among these, the first and second substrates 10 and 14 are ceramic substrates, and respectively include ceramic plates (insulating plates) 15 and 16, and Cu layers (conductive layers) 17 and 18 provided on both surfaces of the respective ceramic plates 15 and 16. Additionally, the Cu layers 17 and 18 respectively on the opposing surface sides of the first substrate 10 and the second substrate 14 form respective circuit pattern 17a and 18a of the semiconductor module 3. Here, the first and second substrates 10 and 14 are not limited to the ceramic substrates, and may be, for example, aluminum substrates. An aluminum substrate has a structure such that Cu layers are provided on both surfaces of the aluminum plate through insulating layers.

The first and second semiconductor devices 11 and 13 are power devices, such as power diodes or power transistors, which generate a relatively large amount of heat during operation. The first semiconductor element 11 and the second semiconductor element 13 are mounted respectively on the opposing surface sides of the first substrate 10 and the second substrate 14, thus being electrically connected to the respective circuit patterns 17a and 18a.

The connector 12 is made of a conductive material, such as Cu. The connector 12 has a first connecting portion 12a, a second connecting portion 12b, and a bridging portion 12c. Among these, the first connecting portion 12a is a portion electrically connecting the first semiconductor element 11 and the second semiconductor element 13. The second connecting portion 12b is a portion to be electrically connected to one of the circuit patterns 17a. The bridging portion 12c is a portion connecting the first connecting portion 12a and the second connecting portion 12b.

The first connecting portion 12a is formed in a columnar shape with a thickness sufficient to keep a distance between the first substrate 10 and the second substrate 14. Both end portions of the first connecting portion 12a are joined to the first semiconductor element 11 and the second semiconductor element 13 through a conductive adhesive (not shown), such as solder. The second connecting portion 12b is formed in a plate shape, and is joined to the one of the circuit patterns 17a through a conductive adhesive (not shown), such as solder. The bridging portion 12c is formed in an elongated plate shape with a length enough to connect the first connecting portion 12a and the second connecting portion 12b. One end side of the bridging portion 12c is integrally connected to a side surface of the first connecting portion 12a. The other end side of the bridging portion 12c is bent to the second connecting portion 12b side, thus being integrally connected to the second connecting portion 12b.

A spacer 19 is disposed between the first substrate 10 and the second substrate 14. The spacer 19, along with the first connecting portion 12a, keeps the distance between the first substrate 10 and the second substrate 14. Additionally, the spacer 19, as a circuit component of the semiconductor module 3, is disposed in a state of being sandwiched between the circuit patterns 17a and 18a. Examples of circuit components include a wiring portion, a resistor, a capacitor, and the like.

The circuit board 4 and the plurality of electronic components 5 shown in FIGS. 1 and 2 constitute a controller 30 that controls driving of the semiconductor module 3. Among these, the circuit board 4 is bonded onto the second surface 6b, opposite to the first surface 6a, of the heat sink 2 (base portion 6). On the other hand, the plurality of electronic components 5 are mounted on the circuit board 4. Each electronic component 5 is a heat generating component that generates a smaller amount of heat than each semiconductor module 3.

Some electronic components 5 of the plurality of electronic components 5 and the semiconductor modules 3 are electrically connected via a connector 20. The connector 20 has first insertion outlets 22a and 22b into which the first connecting terminals 21a and 21b on the semiconductor module 3 side are inserted, and a second insertion outlet 24 into which the second connecting terminal 23 on the electronic component 5 side is inserted. The first connecting terminals 21a and 21b on the semiconductor module 3 side, although not shown in FIG. 3, are connected respectively to the circuit patterns 17a and 18a.

The heat sink 2 is provided with an insertion hole 25 which holds the connector 20 that is insertable thereinto. The heat sink 2 is provided with first through-holes 26a and 26b through which the first connecting terminals 21a and 21b on the semiconductor module 3 side are penetrable. The first through-holes 26a and 26b are formed from the bottom surface of the insertion groove 8 toward the insertion hole 25. The heat sink 2 and the circuit board 4 are provided with a second through-hole 27 through which the second connecting terminal 23 on the electronic component 5 side is penetrable. The second through-hole 27 is formed from the surface of the circuit board 4 mounted with the electronic components 5, toward the insertion hole 25. Additionally, the first connecting terminals 21a, 21b and the second connecting terminal 23 are electrically insulated from the first through-holes 26a, 26b and the second through-hole 27.

In the heat dissipating structure 1 having the above structure, the semiconductor modules 3, in the state of being inserted into the insertion grooves 8, are in contact with the respective heat-dissipating fins 7B. Thereby, heat emitted by the semiconductor module 3 transmits from the inner wall surfaces of the insertion groove 8, that are, from the first and second substrates 10 and 14 in contact with the fin portions 7a, and 7b, to the heat dissipating fins 7B, thus being dissipated to the outside. On the other hand, heat emitted by the plurality of electronic components 5 transmits from the circuit board 4 through the base portion 6 to the heat dissipating fins 7A and 7B, thus being dissipated to the outside. In this case, the heat emitted by the semiconductor module 3 directly transmits to the heat-dissipating fins 7B without through the base portion 6, thus shortening the heat transfer path, thereby increasing the heat dissipation performance of the semiconductor module 3.

As described above, in the heat dissipating structure 1 of the present embodiment, the semiconductor modules 3 are disposed in contact with the heat dissipating fins 7B, thereby making it possible to achieve high heat dissipation performance compared to conventional cases where the semiconductor modules 3 are disposed on the second surface 6b of the base portion 6.

Additionally, in the heat dissipating structure 1 of the present embodiment, the semiconductor modules 3 are disposed in the state of being inserted in the insertion grooves 8, thus enabling miniaturization compared to the conventional cases where the semiconductor modules 3 are disposed on the second surface 6b of the base portion 6.

Further, the first and second substrates 10 and 14 of the semiconductor module 3 are made in contact with the fin portions 7a and 7b, thereby making it possible to efficiently perform the heat dissipation from the semiconductor modules 3.

Moreover, in the heat dissipating structure 1 of the present embodiment, the first semiconductor modules 3 disposed on the first surface 6a side of the base portion 6 are electrically connected via the connectors 20 to the electronic components 5 disposed on the second surface 6b side of the base portion 6. Thus, it is possible to connect the semiconductor modules 3 and the electronic components 5 by a short distance, thus making it possible to reduce the electrical resistance and to reduce the power loss.

Figure 4A:
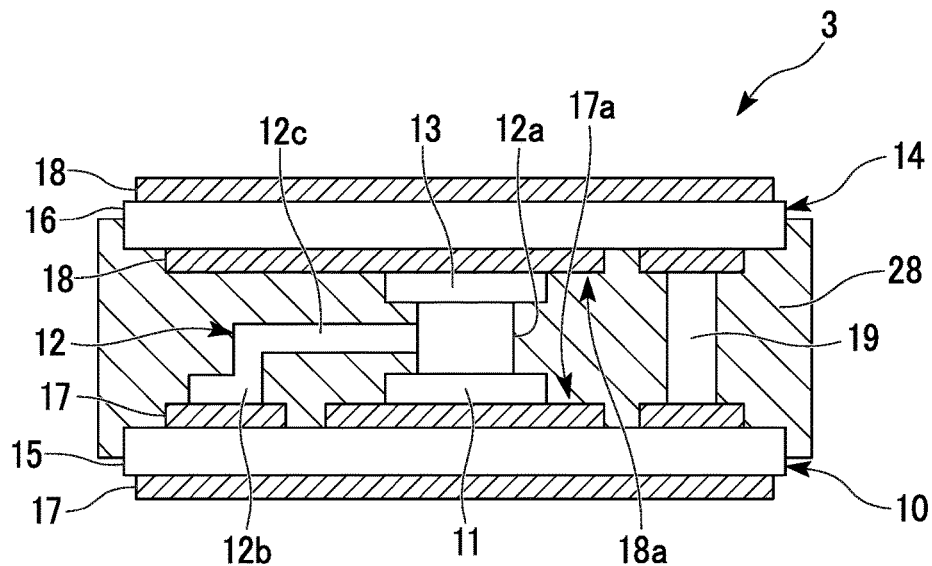
FIG. 4A is a schematic cross-sectional view showing a semiconductor module provided with a molding resin.

Incidentally, regarding the semiconductor module 3, as schematically shown in FIG. 4A, in order for ensuring of the insulation and protection against particles, a mold resin 28 is provided to seal the opposing surface sides of the first substrate 10 and the second substrate 14. However, such a mold resin 28 is likely to cause cracking and the like during thermal expansion, due to a large difference in linear expansion coefficient between the first and second semiconductor elements 11, 13 and the first and second substrates 10, 14.

Figure 4B:
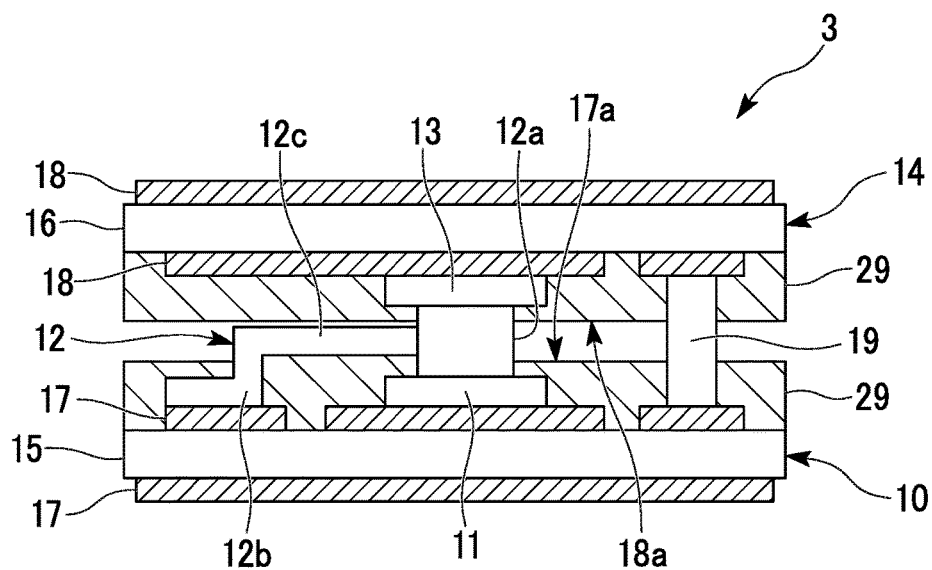
FIG. 4B is a schematic cross-sectional schematic view showing a semiconductor module provided with an insulating film.

In contrast, in the present invention, as schematically shown in FIG. 4B, a configuration may be such that in place of the mold resin 28, an insulating film 29 is provided to cover the opposing surfaces of the first substrate 10 and the second substrate 14. As the insulating film 29, an insulating material with high thermal conductivity, such as ceramic, is used.

In the heat dissipating structure 1 of the present embodiment, the semiconductor module 3 provided with such an insulating film 29 is inserted into the insertion groove 8, thereby making it possible to achieve securing of the insulation and protection against the particles. Additionally, in a case where the insulating film 29 is provided, not only the heat dissipation performance from the semiconductor modules 3 is enhanced by thinning the insulating film 29, but also it becomes possible to suppress generation of cracks due to the difference in linear expansion coefficient. Further, since a step for sealing with the molding resin 28 can be omitted, thereby enabling simplification of the manufacturing process.

Here, the present invention is not necessarily limited to the above embodiment, and various modifications may be added without departing from the scope of the present invention.

Figure 5A:
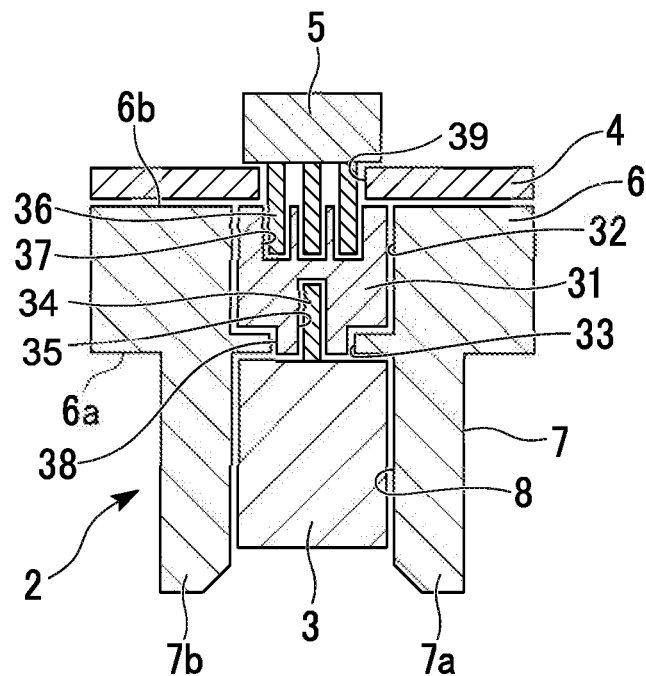
FIG. 5A is a cross-sectional view showing an example of a connecting structure of a connector.
Figure 5B:
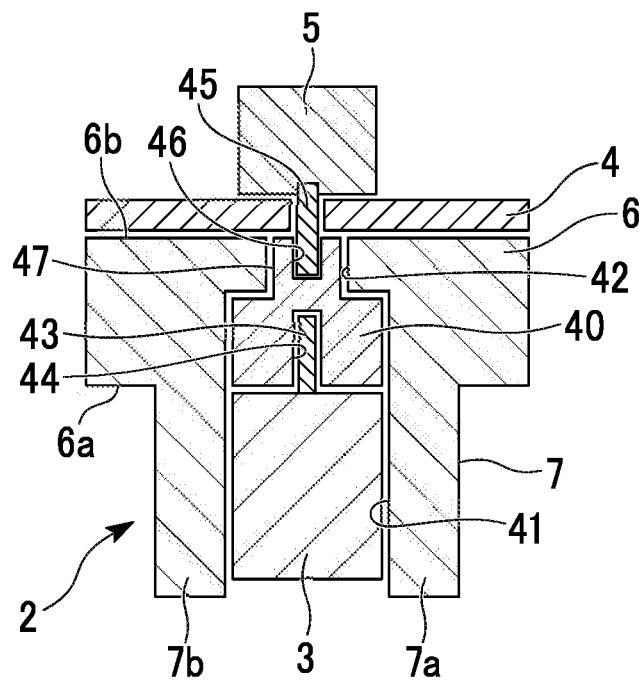
FIG. 5B is a cross-sectional view showing another example of a connecting structure of a connector.

In the present invention, for example, as shown in FIGS. 5A and 5B, it is also possible to change the connecting structure of the above-described connector 20 that connects the semiconductor module 3 and the electronic component 5.

Specifically, a connecting structure of a connector 31 shown in FIG. 5A is a structure provided with, instead of the above-described insertion hole 25, an insertion groove 32 which holds the connector 31 that is insertable thereinto from the second surface 6b side of the base portion 6. Additionally, a through-hole 33 is provided between a bottom surface of the insertion groove 32 and the bottom surface of the insertion groove 8. The connector 31 has a first outlet 35 into which a first connecting terminal 34 on the semiconductor module 3 side is insertable, a second outlet 37 into which a plurality of second connecting terminals 36 on the electronic component 5 side are insertable, and a protruding portion 38 fitted into the through-hole 33. The circuit board 4 is provided with a through-hole 39 through which the plurality of second connecting terminals 36 are penetrable.

On the other hand, a connecting structure of a connector 40 shown in FIG. 5B is a structure provided with, instead of the insertion hole 25, an insertion groove 41 that holds the connector 40 and the semiconductor module 3 that are insertable thereinto from the first surface 6a side of the base portion 6. Additionally, the insertion groove 41 is provided with a through-hole 42. The connector 40 has a first outlet 44 into which a first connecting terminal 43 on the semiconductor module 3 side is insertable, and a second outlet 46 into which a second connecting terminal 45 on the electronic component 5 side is insertable, and a protruding portion 47 fitted into the through-hole 42.

As described above, it is also possible to employ, in the present invention, the connecting structure of the connector 31 shown in FIG. 5A, or the connecting structure of the connector 40 shown in FIG. 5B.

Figure 6A:
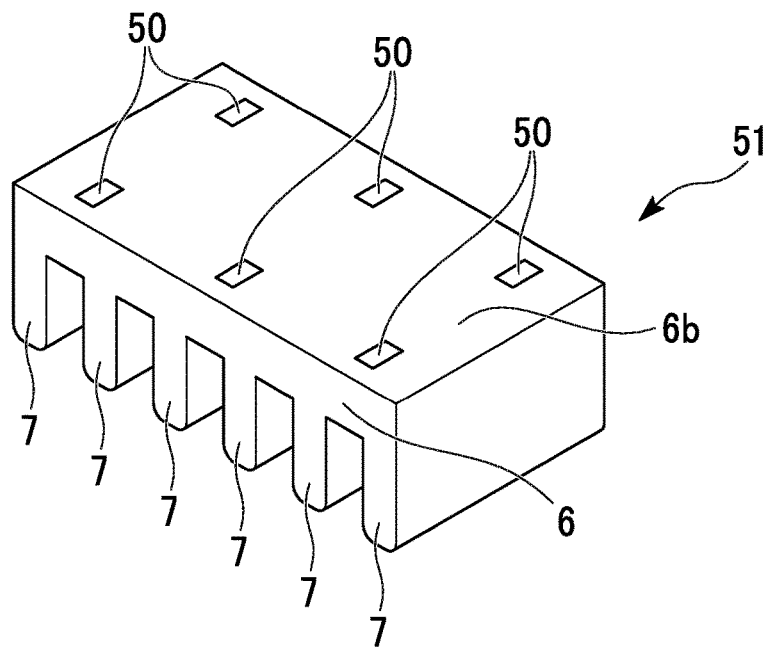
FIG. 6A is a perspective view, viewed from a second surface side, showing a heat sink previously provided with a plurality of connectors.
Figure 6B:
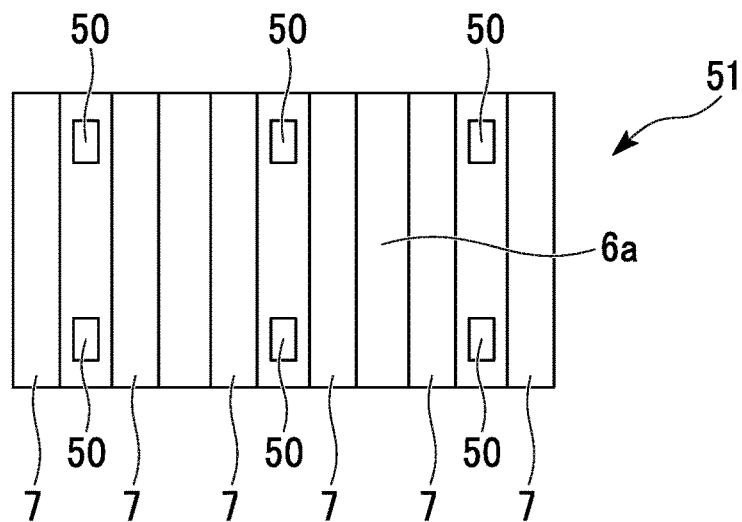
FIG. 6B is a perspective view, viewed from the first surface side, showing the heat sink previously provided with the plurality of connectors.

Additionally, in the present invention, for example, as shown in FIGS. 6A and 6B, it is also possible to use a heat sink 51 previously provided with a plurality of connectors 50. Each of the plurality of connectors 50 has a first outlet on the first surface 6a of the base portion 6 and a second outlet on the second surface 6b of the base 6, so that the connecting terminal of the semiconductor module 3 inserted between the heat dissipating fins 7 is insertable into the first outlet, and a connecting terminal of the electronic component 5 is insertable into the second outlet.

Here, the disposition and numbers of the plurality of connectors 50 can be changed arbitrarily. A configuration may be such that the connector 50 is slidably mounted on the heat sink 51. In this configuration, it is possible to move the position of the connector 50.

Figure 7A:
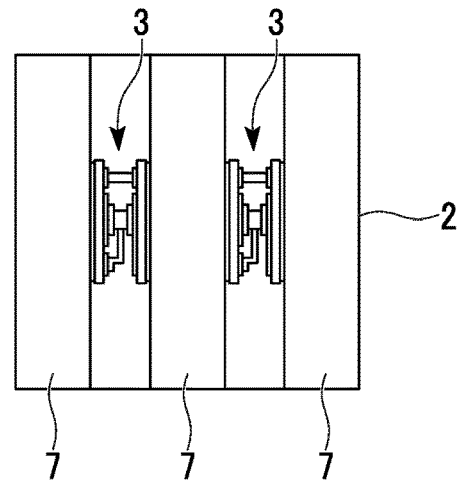
FIG. 7A is a plan view showing an example of disposition of the semiconductor module.
Figure 7B:
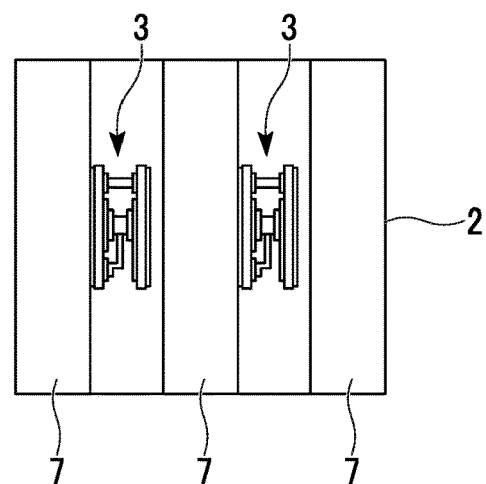
FIG. 7B is a plan view showing an example of disposition of the semiconductor module.
Figure 7C:
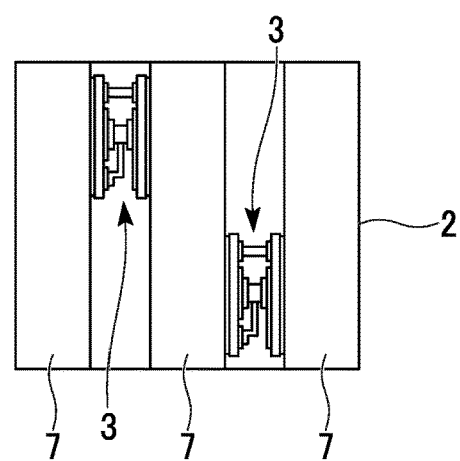
FIG. 7C is a plan view showing an example of disposition of the semiconductor module.

Additionally, a configuration may be such that the semiconductor module 3 is in contact with at least one heat dissipating fin 7A (7B) of the plurality of heat dissipating fins 7A and 7B. Accordingly, a configuration may be such that the semiconductor module 3 is sandwiched between the adjacent heat dissipating fins 7, as shown in FIG. 7A, or the semiconductor module 3 is in contact with one side surface of the heat dissipating fin 7, as shown in FIG. 7B. Further, the semiconductor modules 3 are not limited to the above-described configuration that the semiconductor modules 3 are arranged facing each other through the heat dissipating fin 7. Instead, a configuration may be such that the semiconductor modules 3 are shifted away from each other through the heat dissipating fin 7, as shown in FIG. 7C.

Further, the first heat generating components of the present invention are not necessarily limited to the above-described semiconductor modules 3, and the disposition, the number, and the like thereof can appropriately be modified. Additionally, the insertion groove 8 can appropriately be modified in accordance with the size of the first heat generating components. Accordingly, the plurality of heat dissipating fins 7 may be provided with insertion grooves 8 with different depths and widths in accordance with the size of the respective first heat generating components.

Moreover, the present invention is not limited to the configuration provided with the lid member 9 that closes the insertion opening of the above-described insertion groove 8. It is possible to employ a configuration provided with an insertion hole which holds the semiconductor module 3 that is insertable thereinto, such as the above-described the insertion hole 25.

Figure 8A:
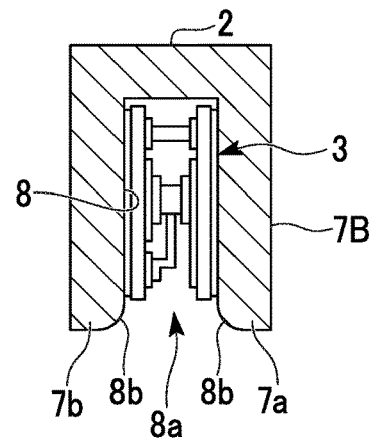
FIG. 8A is a cross-sectional view showing a modified example of an insertion groove.
Figure 8B:
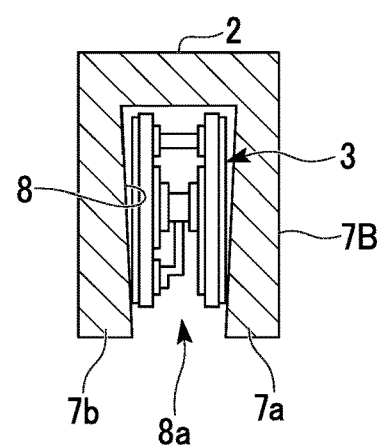
FIG. 8B is a cross-sectional view showing a modified example of the insertion groove.
Figure 8C:
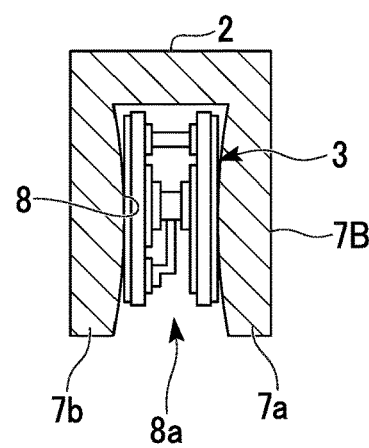
FIG. 8C is a cross-sectional view showing a modified example of the insertion groove.

Additionally, in the present invention, for example, as shown in FIG. 8A, in order to facilitate insertion of the semiconductor module 3 into the insertion groove 8, a configuration may be such that the insertion opening 8a is provided with a tapered portion 8b. Further, the insertion groove 8 is not limited to the above-described shape with a constant width. Instead, for example, a configuration in a shape with a width gradually narrowed toward the end portion in the depth direction (so-called a wedge shape), as shown in FIG. 8B, or a configuration in a shape with a width gradually narrowed toward the central portion in the depth direction (so-called an hourglass shape), as shown in FIG. 8C, may be employed in order to prevent the semiconductor module 3 inserted into the insertion groove 8 from being easily detached therefrom. Moreover, the semiconductor modules 3 are inflated during heat dissipation, and thus adheres tightly onto the fin portions 7a and 7b, thereby making it possible to increase heat dissipation performance.

DESCRIPTION OF REFERENCE NUMERALS

1 . . . heat dissipating structure, 2 . . . heat sink, 3 . . . semiconductor module (first heat generating component), 4 . . . circuit board, 5 . . . electronic component (second heat generating component), 6 . . . base portion, 6a . . . first surface, 6b . . . second surface, 7 . . . heat dissipating fin, 8 . . . insertion groove, 9 . . . lid member, 10 . . . first substrate, 11 . . . first semiconductor element, 12 . . . connector, 13 . . . second semiconductor element, 14 . . . second substrate, 15, 16 . . . ceramic plate (insulating plate), 17, 18 . . . Cu layer (conductive layer), 17a, 18a . . . circuit pattern, 19 . . . spacer, 20 . . . connector, 21a, 21b . . . first connecting terminal, 22a, 22b . . . first outlet, 23 . . . second connecting terminal, 24 . . . second outlet, 25 . . . insertion hole, 26a, 26b . . . first through-hole, 27 . . . second through-hole, 28 . . . mold resin, 29 . . . insulating film, 30 . . . controller, 31 . . . connector, 32 . . . insertion groove, 33 . . . through-hole, 34 . . . first connecting terminal, 35 . . . first outlet, 36 . . . second connecting terminal, 37 . . . second outlet, 38 . . . protruding portion, 39 . . . through-hole, 40 . . . connector, 41 . . . insertion groove, 42 . . . through-hole, 43 . . . first connecting terminal, 44 . . . first outlet, 45 . . . second connecting terminal, 46 . . . second outlet, 47 . . . protruding portion, 50 . . . connector, 51 . . . heat sink, 52 . . . first outlet, 53 . . . second outlet

The invention claimed is:
1. A heat dissipating structure, comprising:
a heat sink having a base portion and at least one heat dissipating fin, the base portion having first and second surfaces opposing each other, the at least one heat dissipating fin extending perpendicularly from the first surface, each of the at least one heat dissipating fin having a first insertion groove, and first and second fin portions separated by the first insertion groove, and the first insertion groove extending from an end portion thereof toward the base portion;
a first heat generating component inserted into the first insertion groove, the first heat generating component being in contact with at least one fin portion of the first and second fin portions;
a circuit board on the second surface of the base portion and electrically connected to the first heat generating component;
a second heat generating component on the circuit board, the second heat generating component generating a smaller amount of heat than the first heat generating component; and
a connector in the base portion, the connector being over the first insertion groove in plan view, and the connec- tor electrically connecting the first heat generating component and the second heat generating component, wherein the base portion has a second insertion groove and a through-hole over the first insertion groove in plan view, the connector being insertable from the second surface into the second insertion groove, and the through-hole connecting the first insertion groove and the second insertion groove, the connector has a first surface facing the first heat generating component and a second surface facing the second heat generating component, the first surface of the connector has a first insertion outlet into which a first connecting terminal that electrically connects the first heat generating component to the connector is insertable, and the second surface of the connector has a second insertion outlet into which a second connecting terminal that electrically connects the second heat generating component to the connector is insertable, and the connector has a protruding portion protruding in an extending direction of the first and second fin portions and fitted into the through-hole.

2. The heat dissipating structure according to claim 1, further comprising:
a plurality of connectors including the connector, the plurality of connectors being in the base portion, and the plurality of connectors being over the first insertion groove in plan view.

3. The heat dissipating structure according to claim 1, wherein the first heat generating component is inserted between the first and second fin portions.

4. The heat dissipating structure according to claim 1, wherein the first heat generating component includes a first substrate, a first semiconductor element, a connector, a second semiconductor element, and a second substrate, which are layered in this order, and
the first and second substrates are in contact respectively with the first and second fin portions.

5. The heat dissipating structure according to claim 4, further comprising:
a protection film covering opposing surfaces of the first and second substrates.

6. A heat dissipating structure, comprising:
a heat sink having a base portion and at least one heat dissipating fin, the base portion having first and second surfaces opposing each other, the at least one heat dissipating fin extending perpendicularly from the first surface, each of the at least one heat dissipating fin having a first insertion groove, and first and second fin portions separated by the first insertion groove, and the first insertion groove extending from an end portion thereof towards the base portion;

a first heat generating component inserted into the first insertion groove, the first heat generating component being in contact with at least one fin portion of the first and second fin portions;

a circuit board on the second surface of the base portion and electrically connected to the first heat generating component;

a second heat generating component on the circuit board, the second heat generating component generating a smaller amount of heat than the first heat generating component; and a connector in the base portion, the connector being over the first insertion groove in plan view, and the connector electrically connecting the first heat generating component and the second heat generating component, wherein the base portion has a second insertion groove and a through-hole over the first insertion groove in plan view, the second insertion groove being connected to the first insertion groove, the connector being insertable from the first surface of the base portion into the second insertion groove, and the through-hole extending perpendicular from the second surface of the base portion and connecting to the second insertion groove, the connector has a first surface facing the first heat generating component and a second surface facing the second heat generating component, the first surface of the connector has a first insertion outlet into which a first connecting terminal that electrically connects the first heat generating component to the connector is insertable, and the second surface facing the second heat generating component has a second insertion outlet into which a second connecting terminal that electrically connects the second heat generating component to the connector is insertable, and the connector has a protruding portion protruding in an extending direction of the first and second fin portions and fitted into the through-hole.

* * * * *